US012581898B2

(12) United States Patent
Fulford et al.

(10) Patent No.: US 12,581,898 B2
(45) Date of Patent: *Mar. 17, 2026

(54) DEVICE AND METHOD FOR DETERMINING WAFER BOW

(71) Applicant: Tokyo Electron Limited, Tokyo (JP)

(72) Inventors: Daniel Fulford, Albany, NY (US); Mark I. Gardner, Austin, TX (US); H. Jim Fulford, Marianna, FL (US)

(73) Assignee: Tokyo Electron Limited, Tokyo (JP)

( * ) Notice: Subject to any disclaimer, the term of this patent is extended or adjusted under 35 U.S.C. 154(b) by 145 days.

This patent is subject to a terminal disclaimer.

(21) Appl. No.: 18/511,448

(22) Filed: Nov. 16, 2023

(65) Prior Publication Data

US 2025/0167023 A1      May 22, 2025

(51) Int. Cl.
| | |
|---|---|
| *H01L 21/67* | (2006.01) |
| *G01B 7/14* | (2006.01) |
| *H01L 21/66* | (2006.01) |
| *H01L 21/687* | (2006.01) |

(52) U.S. Cl.
CPC .......... H01L 21/67288 (2013.01); G01B 7/14 (2013.01); H01L 21/68742 (2013.01); H01L 22/20 (2013.01); G01B 2210/56 (2013.01)

(58) Field of Classification Search
None
See application file for complete search history.

(56) References Cited

U.S. PATENT DOCUMENTS

| | | | | |
|---|---|---|---|---|
| 6,333,572 B1* | 12/2001 | Ono | .......................... | G03F 9/70 |
| | | | | 310/12.06 |
| 6,828,805 B2* | 12/2004 | Izumi | ..................... | H10D 86/00 |
| | | | | 361/278 |
| 7,659,964 B2* | 2/2010 | Lin | ................... | H01L 21/67288 |
| | | | | 355/72 |
| 8,225,683 B2* | 7/2012 | Bailey, III | ............. | G01B 21/20 |
| | | | | 73/104 |
| 8,284,395 B2* | 10/2012 | Kamiyama | ....... | H01L 21/67253 |
| | | | | 356/237.5 |
| 8,723,536 B2* | 5/2014 | Miyazaki | ............... | G01R 31/00 |
| | | | | 324/750.01 |
| 11,105,753 B2* | 8/2021 | Zeng | ................... | G01N 21/9501 |

(Continued)

FOREIGN PATENT DOCUMENTS

JP          60-154617 A      8/1985

OTHER PUBLICATIONS

International Search Report and Written Opinion issued Feb. 20, 2025 in PCT/US2024/054803, 10 pgs.

*Primary Examiner* — Richard Isla
(74) *Attorney, Agent, or Firm* — Oblon, McClelland, Maier & Neustadt, L.L.P.

(57) ABSTRACT

An apparatus for measuring bow of a wafer includes a substrate holder including a support surface configured to support a wafer, and an air flow system including a plurality of air outlets in the support surface which are configured to output air for elevating the wafer above the substrate holder. A capacitor array unit including a plurality of electrodes laterally spaced from one another in the capacitor array unit, each electrode facing the support surface and being spaced a respective fixed distance from the support surface such that each electrode can form a capacitor with an opposing area of a wafer elevated by the substrate holder.

14 Claims, 4 Drawing Sheets

(56)          References Cited

U.S. PATENT DOCUMENTS

| 11,282,726 B2 * | 3/2022 | Tsai | G01M 3/3254 |
| 11,830,708 B2 | 11/2023 | Savas et al. | |
| 12,072,176 B2 * | 8/2024 | Zeng | G01B 11/2441 |
| 2009/0061539 A1 | 3/2009 | Motoyama | |
| 2023/0282501 A1 | 9/2023 | Son | |
| 2025/0123090 A1 * | 4/2025 | Fulford | G01B 7/28 |

* cited by examiner

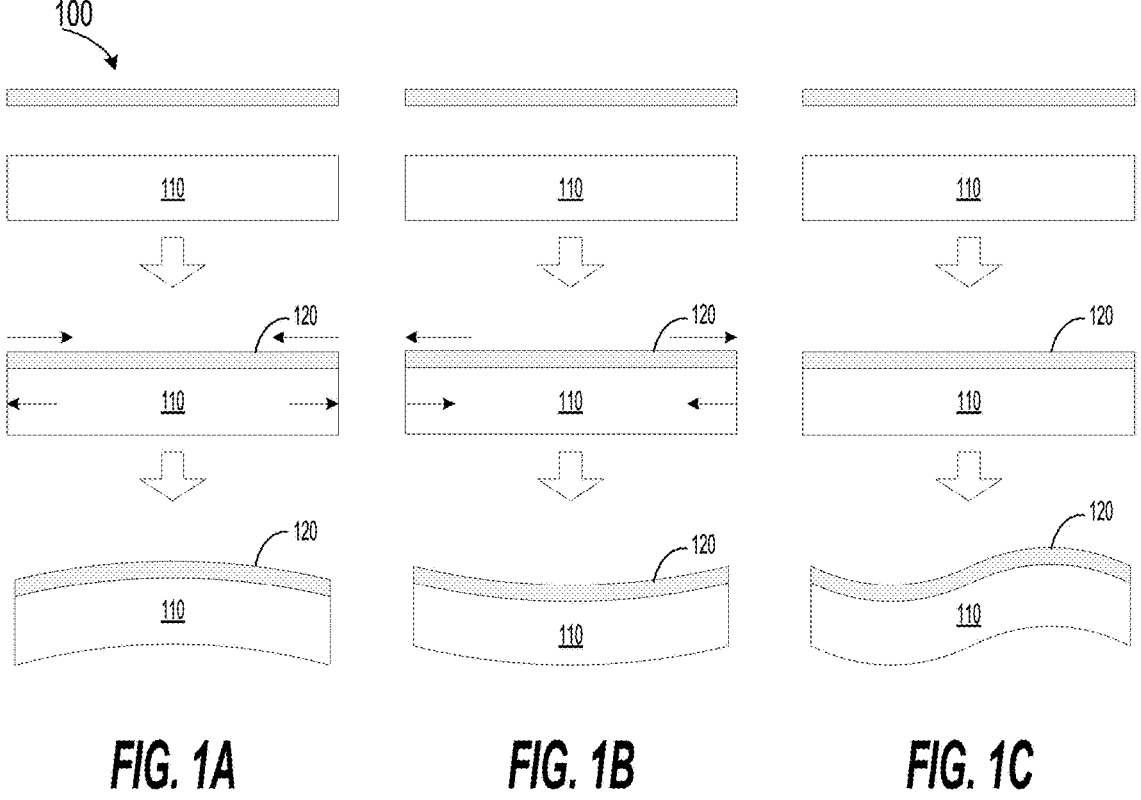
FIG. 1A          FIG. 1B          FIG. 1C
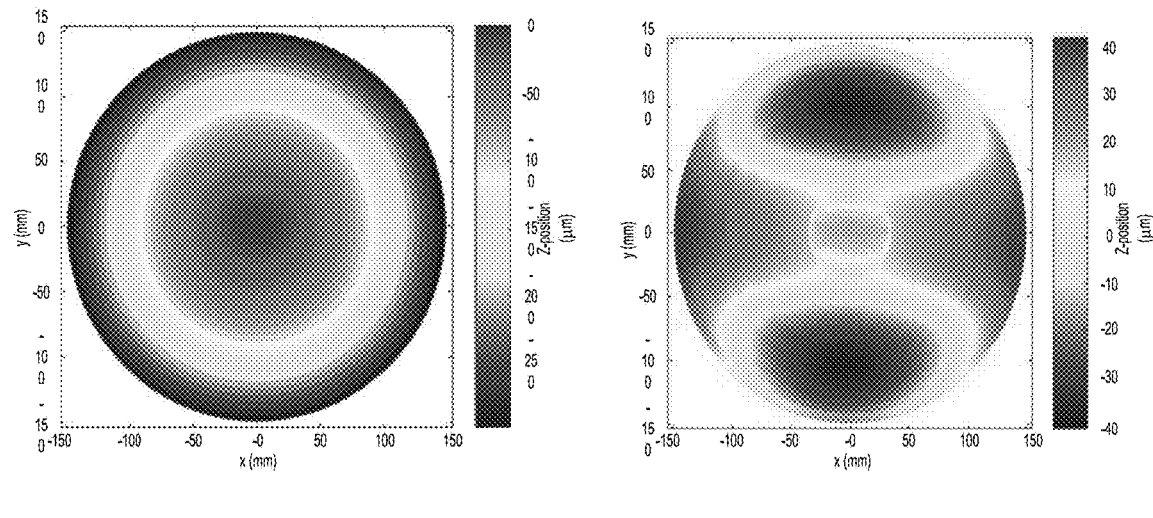
FIG. 2A                    FIG. 2B

DEVICE AND METHOD FOR DETERMINING WAFER BOW

FIELD OF THE INVENTION

The present disclosure relates to semiconductor fabrication, and, more particularly, to determining wafer bow and characterizing wafer bow.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Semiconductor fabrication involves multiple varied steps and processes. One typical fabrication process is known as photolithography (also called microlithography). Photolithography uses radiation, such as ultraviolet or visible light, to generate fine patterns in a semiconductor device design. Many types of semiconductor devices, such as diodes, transistors, and integrated circuits, can be constructed using semiconductor fabrication techniques including photolithography, etching, film deposition, surface cleaning, metallization, and so forth.

Exposure systems are used to implement photolithographic techniques. An exposure system typically includes an illumination system, a reticle (also called a photomask) or spatial light modulator (SLM) for creating a circuit pattern, a projection system, and a wafer alignment stage for aligning a photosensitive resist-covered semiconductor wafer. The illumination system illuminates a region of the reticle or SLM with a (preferably) rectangular slot illumination field. The projection system projects an image of the illuminated region of the reticle pattern onto the wafer. For accurate projection, it is important to expose a pattern of light on a wafer that is relatively flat or planar, preferably having less than 10 microns of height deviation.

SUMMARY

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

An aspect (1) includes an apparatus for measuring bow of a wafer, including a substrate holder including a support surface configured to support a wafer, and an air flow system including a plurality of air outlets in the support surface which are configured to output air for elevating the wafer above the substrate holder. A capacitor array unit including a plurality of electrodes laterally spaced from one another in the capacitor array unit, each electrode facing the support surface and being spaced a respective fixed distance from the support surface such that each electrode can form a capacitor with an opposing area of a wafer elevated by the substrate holder.

An aspect (2) includes the apparatus of aspect (1), wherein the air flow system includes a plurality of air inlets with each air inlet coupled to a respective plurality of the air outlets.

An aspect (3) includes the apparatus of aspect (1), wherein the air outlets are arranged on the support surface in a grid array pattern.

An aspect (4) includes the apparatus of aspect (1), wherein the plurality of electrodes are provided in a common plane such that the respective fixed distances of each electrode are equal.

An aspect (5) includes the apparatus of aspect (1), wherein the capacitor array unit includes an insulating structure having a first surface facing the support surface and a second surface opposite to the first surface, the insulating structure supporting the plurality of electrodes; and a plurality of signal lines supported by the insulating structure, each signal line being connected to a respective one of the plurality of electrodes.

An aspect (6) includes the apparatus of aspect (5), wherein each of the electrodes includes a capacitor plate provided on the first surface of the insulating structure.

An aspect (7) includes the apparatus of aspect (5), wherein each of the electrodes includes a capacitor plate which is at least partially embedded within the insulating structure.

An aspect (8) includes the apparatus of aspect (5), wherein each of the signal lines is at least partially embedded within the insulating structure.

An aspect (9) includes the apparatus of aspect (1), further including a cable coupled to the capacitor array unit and configured to bundle the plurality of signal lines as an input-output cable for the capacitor array unit.

An aspect (10) includes the apparatus of aspect (1), further including a controller electrically connected to each electrode and configured to be electrically connected to a wafer supported by the wafer support surface.

An aspect (11) includes the apparatus of aspect (10), wherein the controller includes a voltage source configured to provide a voltage to each electrode; and a capacitance measurement device configured to measure a capacitance on each electrode based on a respective voltage provided thereto.

An aspect (12) includes the apparatus of aspect (11), further including a processing unit including a processor and a memory for storing software which, when executed by the processor, calculates a distance from each electrode to an opposing area of a wafer provided on the substrate holder based on a capacitance measured on each respective electrode.

An aspect (13) includes the apparatus of aspect (11), wherein the memory stores software which, when executed by the processor, provides a wafer bow mapping based on the distance from each electrode to the opposing area of a wafer provided on the substrate holder.

An aspect (14) includes the apparatus of aspect (11), wherein the memory stores software which, when executed by the processor, provides a 3D wafer bow mapping based on the distance from each electrode to the opposing area of a wafer provided on the substrate holder.

An aspect (15) includes the apparatus of aspect (11), wherein the memory stores software which, when executed by the processor, controls air flow from the plurality of air outlets.

An aspect (16) includes a method of measuring wafer bow including: providing a plurality of electrodes each facing a respective area of a wafer provided on a support surface such that the electrode and respective area form a capacitor; elevating the wafer by air flow from the support surface; measuring a capacitance value at each electrode; calculating a distance from each electrode to its respective area based on the measured capacitance at the respective electrode; and determining a bow of the wafer based on the calculated distances.

An aspect (17) includes the method of aspect (16), wherein the providing includes providing multiple electrodes provided in a grid array.

An aspect (18) includes the method of aspect (16), further including providing a 3D model of the wafer bow based on the calculated distances.

An aspect (19) includes the method of aspect (16), further including controlling a process performed on the wafer based on the determined bow of the wafer.

An aspect (20) includes the method of aspect (16), further including performing a bow correction process on the wafer based on the determined bow of the wafer.

BRIEF DESCRIPTION OF THE DRAWINGS

Various embodiments of this disclosure that are proposed as examples will be described in detail with reference to the following figures, wherein like numerals reference like elements, and wherein:

FIGS. 1A to 1C show first and second order bowing of a wafer;

FIGS. 2A and 2B show low order global wafer distortion and high order local wafer distortion, respectively;

DETAILED DESCRIPTION

Figures 3A, 3B:
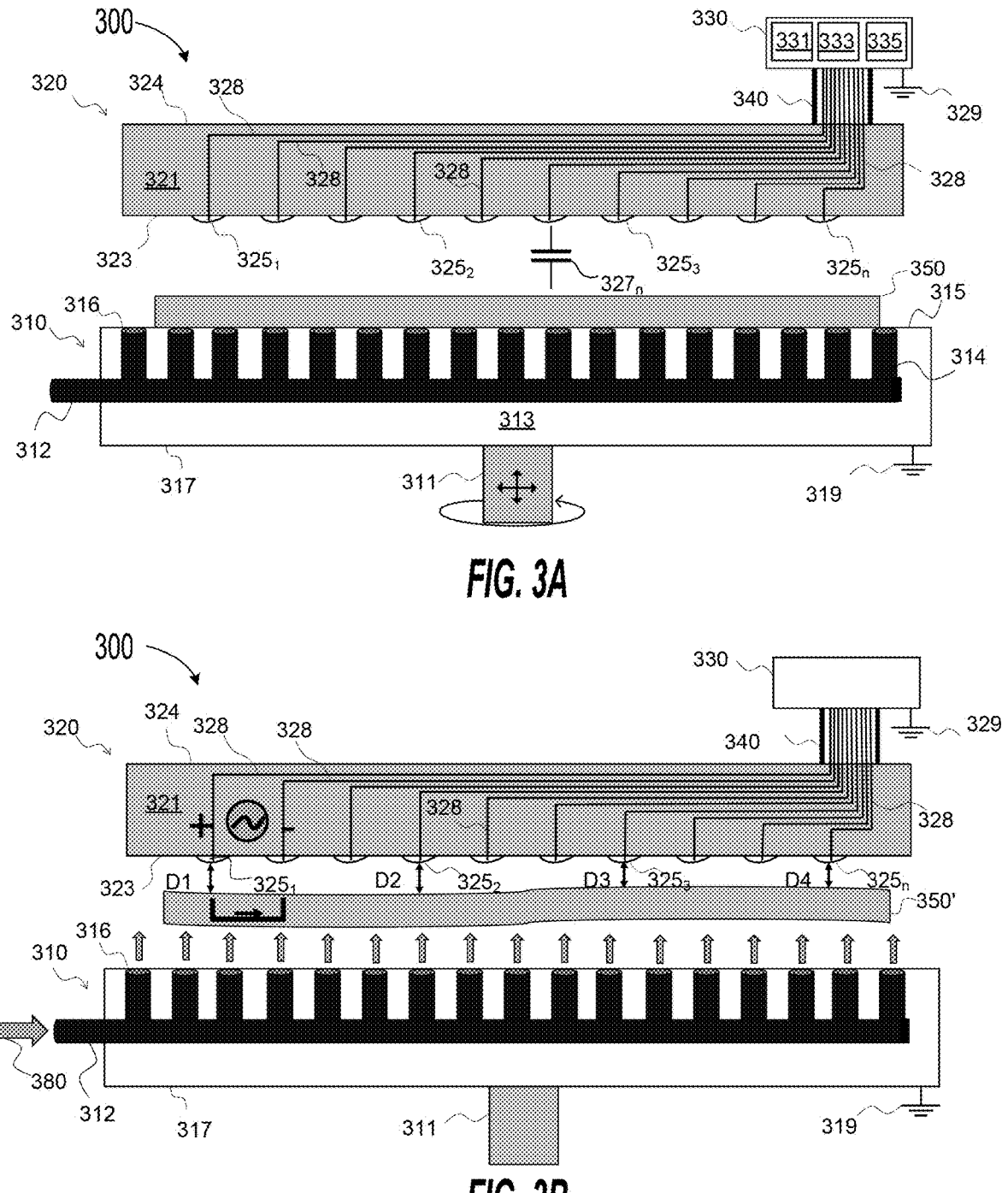
FIG. 3A is a schematic illustration of an apparatus for determining wafer bow according to an example embodiment of the present disclosure.
FIG. 3B is a schematic illustration of the apparatus of FIG. 3A having a bowed wafer thereon.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

A functional semiconductor wafer can include the integration of 70+ individual layers that ultimately culminate in functional devices. Each level requires multiple processing steps including, but not limited to thin film deposition, lithography and etches to form the desired structures. For example, microfabrication of a semiconductor structure 100 begins with a flat substrate or wafer 110, as those illustrated in FIGS. 1A to 1C. During microfabrication of the semiconductor structure 100, multiple processing steps are executed that can include depositing material on the wafer 110, removing material, implanting dopants, annealing, baking, and so forth. Different materials and structural formations 120 thus formed can induce non-uniform wafer stresses, which result in bowing of the semiconductor structure 100, which in turn affects overlay and typically results in overlay errors of various magnitudes.

For example, FIGS. 1A and 1B show how the different materials and structural formations 120 can either induce a compressive or tensile stress in the wafer 110, respectively, resulting in first order bowing with bow measurements illustrating z-direction height (or z-height) deviations from a reference plane (not shown). As another example, FIG. 1C shows second order bowing of the wafer 110 with two bow measurements identifying positive and negative z-height deviations, respectively. The non-uniform wafer stresses fundamentally distort the wafer grid. These distortions can manifest as low order global spherical type deformations as depicted in FIG. 2A, which shows z-height variations on 300 nm semiconductor wafers. Higher order localized z-height variations may exist as stand-alone distortions or may be embedded in the global signature. An example of a higher order wafer deformation is presented in FIG. 2B.

The data presented is derived from standard semiconductor metrology equipment common to the industry. Laser interferometry is a technique that can be used to measure the warp or bow of a wafer. The basic principle behind this technique is that it measures the changes in the wavelength of light that is reflected off the surface of the wafer. In laser interferometry, a laser beam is split into two separate beams using a beam splitter. One beam is directed at the wafer while the other beam is directed at a reference mirror. Both beams are then reflected back to the beam splitter, where they recombine. When the two beams recombine, they create an interference pattern, which can be detected using a photodetector. This interference pattern will be affected by the warping of the wafer. Specifically, if the wafer is warped, then the reflected light waves will have traveled slightly different distances, resulting in a shift in the interference pattern. By analyzing the interference pattern, laser interferometry can measure the degree of warping in the wafer.

Thus, laser interferometry techniques for determining wafer bow require complex hardware and software as well as computing time that reduces measurement throughput. The present inventors have recognized a need for improved systems and methods for determining and characterizing wafer bow.

Techniques herein provide a system and method for determining wafer bow from capacitance measurements at different locations across the wafer. Disclosed embodiments make use of a capacitor structure formed by a measurement electrode and an opposing area of the wafer surface with air between the electrode and wafer surface serving as the capacitor dielectric medium. This novel feature enables calculation of variable distances (i.e. spacing between the electrode and wafer) across the wafer to determine the wafer bow caused by a given process step. Thus, the bow can be calibrated to capacitance both prior and after each wafer processing step, and output can be utilized for processing tools to obtain a more precise wafer surface to enhance wafer patterning. These techniques greatly enhance the ability to obtain precise wafer bow measurements at each step of the wafer fabrication flow. In some embodiments, all capacitors can be measured simultaneously to make out stress regions efficiently and with very good throughput for optimum measurement tool performance.

One issue with existing wafer chucks is that they can alter the bow of the wafer they hold, either through the suction force used to secure the wafer or the gravitational force acting on the wafer while it is on the chuck. For example, a wafer having unacceptable stresses therein may present as having an acceptable flatness when resting on the substrate holder. Techniques herein minimize the alteration of true stresses in the wafer by suspend the wafer without the influence of gravity or the chuck. In some embodiments a wafer chuck with multiple holes on its support surface is utilized to achieve "zero gravity." The wafer is first positioned on the chuck's support surface, after which air flow is applied to lift the wafer above the chuck. A top capacitance plate then measures the capacitance of all the capacitors simultaneously in a contactless fashion. This process is repeated several times, and the average capacitance is calculated. The collected data is then utilized to compute the distance between the wafer and the top plate, enabling the determination of the wafer's bow.

FIG. 3A is a schematic illustration of an apparatus for determining wafer bow according to an example embodiment of the present disclosure. As shown in FIG. 3A, the apparatus 300 includes a substrate holder 310 and a capacitor array unit 320. Substrate holder 310 includes a shaft 311 coupled to a support 313 which includes a support surface 315 for supporting a wafer 350 and an opposite surface to which the shaft 311 is connected. A ground connection 319 can provide the substrate holder 310 at electrical ground potential.

The support 313 includes an air flow system having at least one air inlet 312 and an array of air outlets 316 on the support surface 315. FIG. 3A shows a single air inlet 312 which provides air to a system of channels 314 in the support which distribute air flow to a group of outlets 316 to elevate the substrate in a floating state for bow measurement. In some embodiments, a single inlet 312 is coupled to all outlets 316 of the support (including those not shown in the side view of FIG. 3A). FIG. 3A is also representative of a support 313 including multiple air inlets 312 each of which is configured to flow air to a respective array of outlets 316. That is, the arrangement of an inlet 312, channels 314 and an array of outlets 316 as shown in FIG. 3A can be repeated provided throughout the support 313. In still other embodiments, each inlet 312 may be coupled to a respective single output 316.

The precise number and arrangement of each air outlet 316 may be determined based on the measurement application. For example, the air outlets 316 may be arranged on the support surface 315 in a grid array pattern, a concentric pattern a random pattern or any suitable arrangement for providing consistent elevation of the wafer 350. Controller 360 may be used to control air flow to each inlet 312 thereby controlling air from the outlets 316. Spatial control of air flow from the outlets 316 can be achieved by control of the inlets 312. A very high-density of outlets 316 may be provided and a controller 330 may control air flow to a subset of the outlets to control aspects of the wafer elevation.

The capacitor array unit 320 includes an insulating structure 321 having a first surface 323 facing the substrate holder 310 and a second surface 324 which is opposite to the first surface 323. The insulating structure 321 supports a plurality of electrodes 325 laterally spaced from one another and each facing a different area of the support surface 315 of the substrate holder 310. Four electrodes numbered $325_1$, $325_2$, $325_3$, $325_n$ are shown in FIG. 3A for reference. Each electrode 325 works in conjunction with an area of the wafer 350 directly opposite thereto to form a capacitor with the air gap between the electrode and wafer 350 serving as a dielectric of the capacitor as shown by representative capacitor 327, in FIG. 3A. In the embodiment of FIG. 3A, the plurality of electrodes 325 are provided in a common plane such that the respective fixed distances of each electrode are substantially equal. The electrodes $325_n$ may be implemented as conductive plates formed on the surface 323 of the insulating structure 321. Alternatively, a portion or all of each electrode may be embedded within the insulating structure 321.

The capacitor array unit 320 also includes a plurality of signal lines 328 supported by the insulating structure 321, and at least a portion of each signal line 328 may be embedded within the insulating structure 321. A first end of each signal line 328 is connected to respective electrodes 325 while an opposite end of the signal line provided as an output from the capacitor array unit. Thus, the plurality signal lines 328 are routed from the respective electrodes through the insulating structure 321 and out of the insulating structure as shown in FIG. 3A. The insulating structure may be any suitable dielectric material for electrically insulating the signal lines 328 from one another to prevent short circuiting and crosstalk between the signal lines.

The substrate holder 310 and the capacitor array unit 320 are preferably movable in relation to one another. Such relative movement may be rotational, horizontal and/or vertical as represented by the directional arrows illustrated for the shaft in FIG. 3A. As would be appreciated by one skilled in the art, relative movement between the substrate holder 310 and the capacitor array unit 320 may be implemented by moving the substrate holder 310, the capacitor array unit 320, or both the substrate holder 310 and the capacitor array unit 320.

In the embodiment of FIG. 3A, a controller 330 is connected to the capacitor array unit 320 by way of a cable 340. More specifically, each of the signal lines 328 is routed in a bundle through the cable 340 to the controller 330 such that circuitry within the controller 330 is electrically connected to each electrode 325. A ground contact 329 is connected to the controller 330 to provide the controller and circuitry therein at electrical ground potential. The controller 330 includes a voltage source 331 for providing a voltage on each electrode 325 and a capacitance measurement circuit 333 for measuring a capacitance associated with each electrode 325. The voltage source 331 may provide an AC voltage of any suitable magnitude and frequency for determining a capacitance value at each respective electrode 325. The capacitance measurement circuit may provide any suitable circuit for determining a capacitance value associated with each electrode 325. In some example embodiments, the voltage source 331 may provide an AC voltage to the electrodes 325 and the capacitance measurement device 333 may determine the capacitance value by a capacitive reactance of the capacitor.

The controller 330 also includes a processing unit 335 including a processor and a memory which stores software which, when executed by the processor, causes the controller 330 to perform various functions related to detecting and characterizing wafer bow. In one embodiment, the processing unit executes software for calculating a distance from each electrode 325 to an opposing area of a wafer provided on the substrate holder 310 based on a capacitance measured on each respective electrode. For example, such distance may be determined from the formula C-kA/D, Where C is the capacitance, A is a cross section area of the capacitor electrode, D is the distance between capacitor electrodes, and k is a dielectric constant of the dielectric material between the electrodes of the capacitor. Where the area between the electrodes is pure vacuum, the dielectric constant is 1. As another example, the processing unit 335 executes software that provides a wafer bow mapping based on the distance from each electrode to the opposing area of a wafer provided on the substrate holder. Such wafer bow mapping may be a 3D model of the wafer bow.

As shown in FIG. 3B, air 380 provided to the air input(s) of substrate holder and is routed by channels 314 to the air outlets 316 to elevate the wafer 350'. When elevated in a floating state the wafer 350' experiences "zero gravity" such that stresses in the wafer cause a bow condition which may not be present when the wafer is resting on the support surface 315 with gravity acting on the wafer. The bowed wafer 350' will present local peaks and troughs which result in a variable distance from a top surface of the wafer 350' to the capacitor array unit 320. In the example of FIG. 3B, D1 represents a distance from electrode 325; to the wafer 350', D2 represents a distance from electrode 325$_2$ to the wafer 350', D3 represents a distance from electrode 325$_3$ to the wafer 350' and D4 represents a distance from electrode 325$_n$ to the wafer 350'. As shown, D1, D2, D3 and D4 are different from one another due to the bowed state in wafer 350'.

In one example operation, the voltage source 331 provides an AC voltage with inverse polarity on adjacent electrodes 325 as shown in FIG. 3B. In this embodiment, the bulk of semiconductor wafer is un-biased (i.e., electrically floating) because there is no physical connection to the wafer 350' and air a dielectric. Application of the AC signal to the electrodes 325$_1$ and an adjacent electrode creates a circuit with the two capacitors associated with the respective electrodes in series which causes current flow through the wafer 350' directly opposite the electrodes 325 as also shown in FIG. 3B. The capacitance measurement device 333 then obtains capacitance measurements for each electrode based on the capacitance reactance for example. As the distances D1, D2, D3 and D4 are different from each other, the capacitance values of 325$_1$, 325$_2$, 325$_3$, and 325$_n$ (and their respective adjacent electrodes) are also different from each other. With the capacitance value obtained at each electrode 325$_n$ the controller can calculate a distance value for each of D1, D2, D3 and D4, as well as all other electrodes

325. In some embodiments, the process is repeated several times, and the average capacitance is calculated. The capacitance values (or average capacitance values) at each electrode is used to determine whether the wafer is bowed and characteristics of a bow in the wafer. In some embodiments, the controller may construct a 3D model of the bow in the wafer which can be used to control further processing of the wafer 350'.

In some embodiments, the wafer 350' can be flipped to measure bow on a bottom surface of the wafer opposite to the working surface. This may be advantageous where stress correction film is to be applied to the back side of the wafer 350'. As no physical connection is made to the wafer 350', preprocessing of the wafer to include a conductive layer is not required and measurement throughput can be improved.

Figure 4:
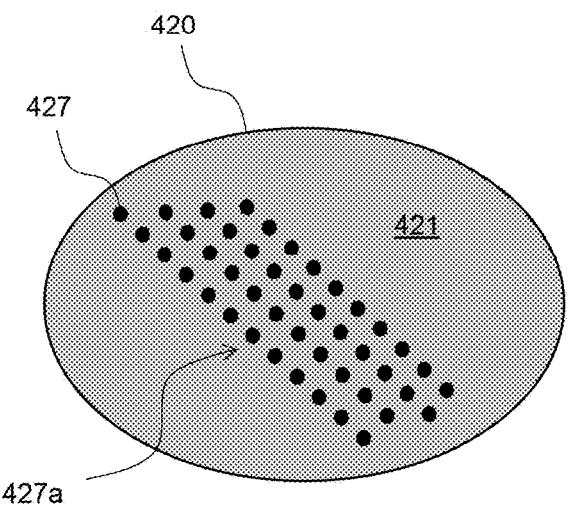
FIG. 4 is a schematic illustration of a capacitor array unit according to an example embodiment of the present disclosure.

FIG. 4 is a plan view of the bottom surface of a capacitor array unit in accordance with one embodiment of the present disclosure. As shown, the capacitor array unit 420 includes an insulating structure 421 with electrodes 427 provided in an electrode grid array pattern 427$a$. The electrode grid array 427$a$ provides 2D mapping in the XY directions of the surface of a wafer provided on a substrate holder, while the capacitance values enable a Z dimension at each electrode. Thus, the electrode grid array 427$a$ enables construction of a 3D model of the wafer bow. The precise number and arrangement of each electrode 427 in the electrode grid array 427$a$ may be determined based on the resolution and throughput of each measurement application. In some embodiments, a high density electrode grid array 427$a$ may be provided and the controller 330 may utilize a subset of the electrodes 427 to reduce time for computing the distance and constructing a 3D model.

Figure 5:
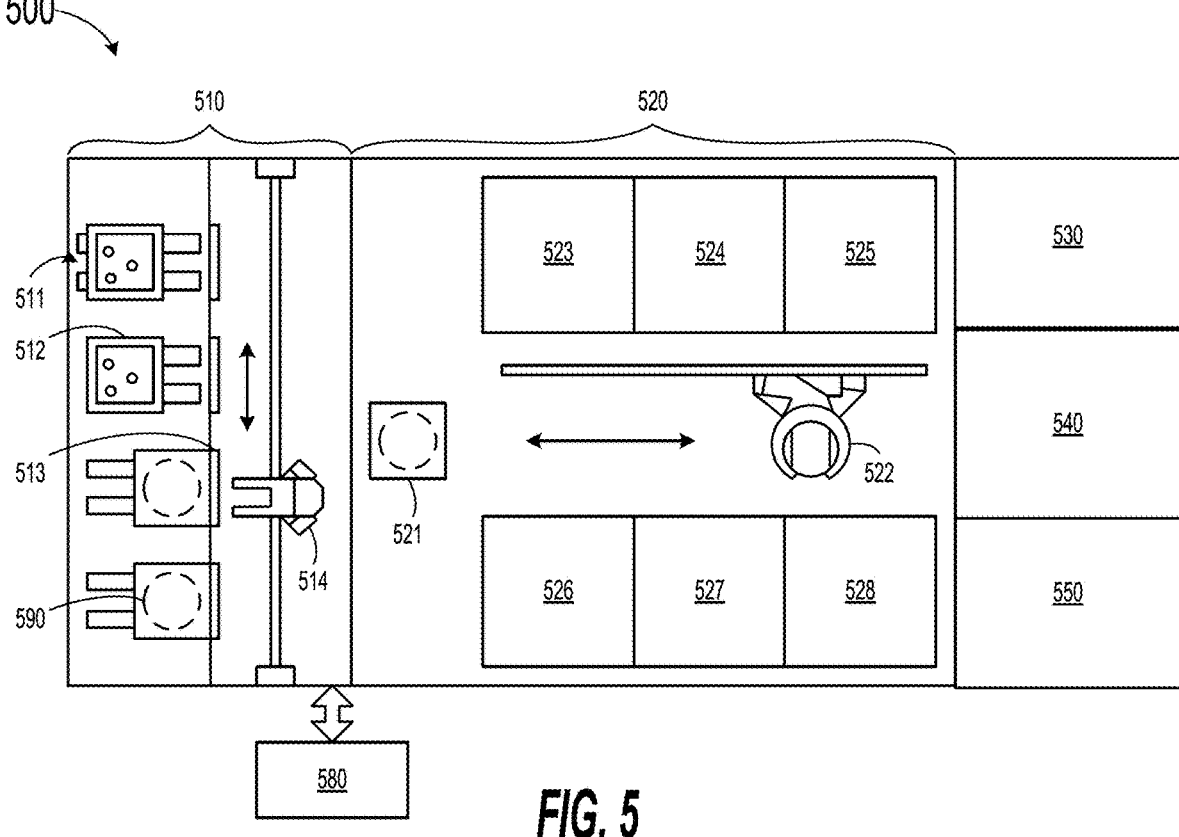
FIG. 5 is a plan view of an exemplary wafer processing system for determining and correcting wafer bow in accordance with some embodiments of the present disclosure.

FIG. 5 is a plan view of an exemplary wafer processing system 500, e.g., a track lithography tool, for correcting or modifying wafer bow in accordance with some embodiments of the present disclosure. The wafer processing system 500 includes various wafer handling components or carriers, along with several stages, e.g., a carrier stage 510 and a treatment stage 520. The carrier stage 510 includes one or more pod assemblies 511 that are configured to receive one or more wafer cassettes 512 that are configured to contain one or more wafers 590, e.g., the wafer 110 shown in FIGS. 1A to 1C, that are to be processed in the wafer processing system 500. Doors 513 can open to access the wafers 590 contained in the wafer cassettes 512. A carrier transfer robot 514 can move up and down and transfer the wafers 590 from the wafer cassettes 512 to a shelf unit 521 that is installed in the treatment stage 520 for storing the wafers 590 temporarily.

The treatment stage 520 includes a variety of treatment modules, e.g., treatment modules 523-528, and a treatment transfer robot 522. The treatment transfer robot 522 is configured to access the shelf unit 521 and the treatment modules 523-528 and transfer the wafers 590 among the treatment modules 523-528 for various processing. In an embodiment, the treatment transfer robot 522 can flip and rotate the wafers 590. The modules 523-528 can include one or more metrology modules 523, which are configured to measure an amount of wafer bow of the wafers 590 and provide bow measurements to the wafer processing system 500. In an embodiment, the metrology modules 523 can use optical (e.g., using a scanning laser technique), acoustic and other mechanisms to measure the z-height deviations across a surface of the wafer and store the height deviations by (x, y) coordinates to identify a plurality of sub-bow measurements (x, y) of the bow measurement. Bow measurements can include measuring a degree of convexity or concavity, or mapping z-height deviation values on the wafers 590 relative to one or more reference z-height deviation values. In other words, z-height deviation values are spatially mapped, such as with coordinate locations, to identify z-height deviation values across a surface of the wafer 590. Bow measurements and z-height deviation values can be mapped at various resolutions depending on types of metrology equipment used and/or a resolution desired. In an embodiment, the metrology modules 523 can also measure the amount of die bow of each of dies obtained by dicing and singulating the wafer 590. In some examples, the treatment transfer robot 522 may first transfer a wafer 590 into the metrology module 523 with a working surface up to measure a bow on the working surface, then remove and flip the wafer and transfer a wafer 590 into the metrology module 523 with a backside surface up to measure a bow on the backside surface.

The bow measurements can include raw bow data or be represented as a bow signature with relative z-height deviation values. In many embodiments, the reference z-height deviation values may be all close to zero and thus representative of a wafer that is close to being flat. For example, a wafer that is close to being flat or considered flat for overlay improvement herein can be a wafer having an average z-height deviation value of less than 10 microns. In some embodiments, the reference z-height deviation values can represent some non-planar shape, but which shape is, notwithstanding, useful for overlay error correction—especially for particular stages of micro fabrication. Techniques herein enable correction of bowing that is greater than 10 microns, for example. The metrology module 523 is configured to measure the wafer 590, which has a working surface and a backside surface opposite to the working surface. The wafer 590 may have an initial wafer bow value resulting from one or more micro fabrication processing steps that have been executed to create at least part of a semiconductor device on the working surface of the wafer 590. For example, field-effect transistors (FETs) may be completed or only partially completed on the working surface of the wafer 590.

The treatment modules 523-528 can also include one or more film formation modules 524 that are configured to form one or more films, e.g., a shape control layer, on a surface of the wafer 590 being processed. The film formation module 524 can be configured to deposit a shape control layer on the frontside and/or backside surface of the wafer 590 using chemical vapor deposition, atomic layer deposition, spin-on film deposition process, or other deposition techniques. The film formation module 524 and the metrology module 523 can be installed on a common platform having an automated wafer handling system that automatically moves the wafer 590 from the metrology module 523 to the film formation module 524.

In an embodiment, the shape control material can include a heat sensitive material, which, when reactive to heat, may have its internal stress modified by the heat to become compressive, neutral or tensile. In another embodiment, the shape control material can include a photosensitive material, which, when exposed to actinic radiation or light, absorbs light in the desired or required energy spectrum and exhibits a chemical/physical reaction that allows applications at different fields.

The treatment modules 523-528 can also include one or more bake modules 525 that are configured to bake the wafer 590 to a target temperature. For example, the bake module 525 can bake and stabilize the wafer 590 at 32° C. or 90° C. As another example, the bake module 525 can bake the wafer 590 with a shape control material (e.g., a heat sensitive material) formed thereon using a pattern of heat that correspond to a bow measurement of the wafer 590, to correct or modify an internal stress of the shape control layer. The treatment modules 523-528 can also include one or more radiation sources 526 that are configured to project onto different regions of the shape control material radiations of variable intensities that correspond to the bow measurement of the wafer 590. The treatment modules 523-528 can also include a plurality of heating units 527, which can be installed on a wafer chuck that is used for a wafer to be placed thereon. The heating units 527 can have an arrangement corresponding to a certain pattern of heat and generate different temperature ranges of heat, and the wafer chuck can thus have a plurality of heating zones that correspond to the certain pattern of heat. Accordingly, the shape control material can be heated in different regions that correspond to the certain pattern of heat and its stresses in the different regions can be modified to become compressive, neutral or tensile.

The wafer processing system 500 further includes a controller 580. The controller 580 can be a computer processor located within the wafer processing system 500, or located remotely but being in communication with components, e.g., the metrology module 523, the film formation module 524, the bake module 525, the radiation source 526 and the heating units 527, of the wafer processing system 500. In some embodiments, the metrology module 523 may perform the functions of the controller 330 discussed above. In an embodiment, the controller 580 is configured to control the metrology module 523 to measure a wafer 590 to identify a bow measurement of the wafer 590, receive the bow measurement from the metrology module 523, control the film formation module 524 to form a shape control layer on the backside (or frontside or both) surface of the wafer 590, control the bake module 525 to differentially bake the wafer 590 with the shape control layer formed thereon using a pattern of heat that corresponds to the bow measurement of the wafer 590, control the radiation source 526 to project on different regions of the shape control layer radiations of variable intensities that correspond to the bow measurement of the wafer 590 and/or control the heating units 527 to generate different temperature ranges of heat that correspond to the a certain pattern of heat, to correct or modify the internal stress of the stressor film. The film formation module 524, the bake module 525 and the controller 580 can be referred to as a wafer processing device.

The wafer processing system 500 can also include other stages or components, e.g., a stepper/scanner 530, a singulation device 540 and a bonding tool 550. The singulation device 540 can be configured to dice and singulate a wafer, with or without a shape control layer formed thereon, to obtain a plurality of chiplets. The bonding tool 550 is configured to connect (join) an integrated chiplet (or die or wafer) with a wafer together in one mechanically stable package.

Figure 6:
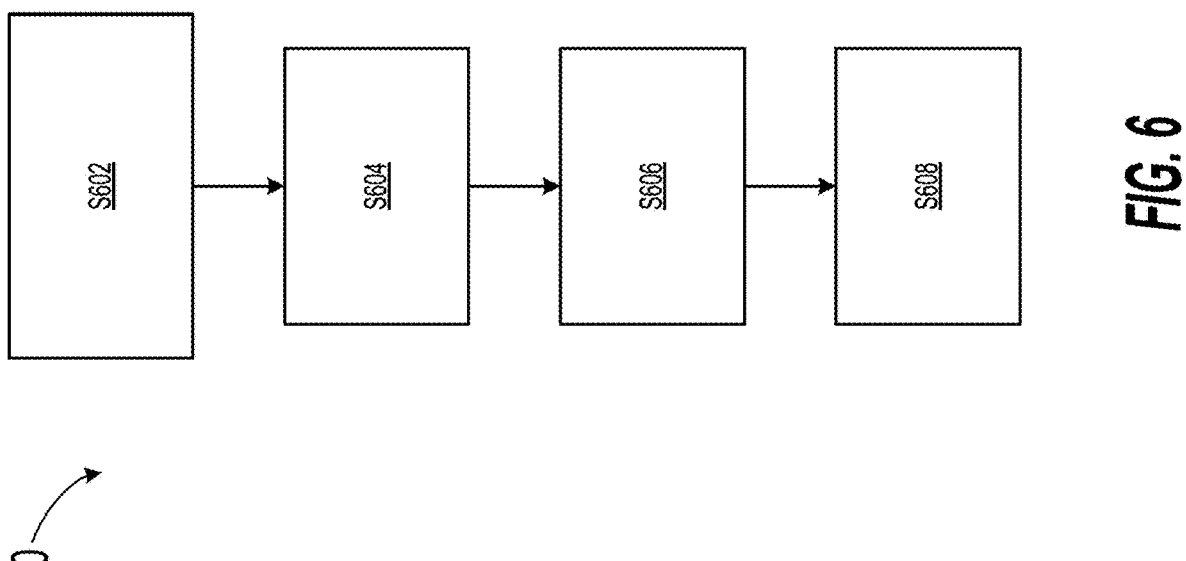
FIG. 6 is a flow of an exemplary method for determining wafer bow according to an example embodiment of the present disclosure.

FIG. 6 is a flow diagram of a method for determining wafer bow in accordance with an example embodiment of the present disclosure. The method 600 includes s602 of providing a plurality of electrodes each facing a respective area of a wafer surface such that the electrode and respective area form a capacitor. In some embodiments, the plurality of electrodes are provided in a common plane such that the distance between each electrode and its respective area of the wafer surface is equal when the wafer does not have any bow. Multiple electrodes may be provided in a grid array.

A capacitance value is measured at each electrode at s604. This step includes providing an input air flow to the substrate holder and distributing the air to outputs on the support surface to elevate the wafer in a "zero gravity" state whereby the bow effects of gravity and contact with the substrate support surface are minimized. In some embodiments, the capacitance measurement is taken multiple times and an average capacitance is obtained for each electrode.

At S606, a distance from each electrode to its respective area on the wafer is calculated based on the measured capacitance at S606. Wafer bow is then determined based on the calculated distances at S608. In some embodiments, S608 includes providing a 3D model of the wafer bow based on the calculated distances. The determined wafer bow may be used to control a process performed on the wafer, such as a bow correction process to mitigate stresses on the bowed wafer.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a dielectric layer on or overlying a base substrate structure such as a thin film. Thus, substrate is not limited to any particular base structure, underlying dielectric layer or overlying dielectric layer, patterned or un-patterned, but rather, is contemplated to include any such dielectric layer or base structure, and any combination of dielectric layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. An apparatus for measuring bow of a wafer, comprising:
a substrate holder comprising:
a support surface configured to support a wafer, and
an air flow system including a plurality of air outlets in the support surface which are configured to output air for elevating the wafer above the substrate holder;
a capacitor array unit comprising a plurality of electrodes laterally spaced from one another in the capacitor array unit, each electrode facing the support surface and being spaced a respective fixed distance from the support surface such that each electrode can form a capacitor with an opposing area of a wafer elevated by the substrate holder;
a controller electrically connected to each electrode and configured to be electrically connected to a wafer supported by the support surface, the controller comprising:
a voltage source configured to provide a voltage to each electrode; and
a capacitance measurement device configured to measure a capacitance on each electrode based on a respective voltage provided thereto; and
a processing unit including a processor and a memory for storing software which, when executed by the processor, calculates a distance from each electrode to an opposing area of a wafer provided on the substrate holder based on a capacitance measured on each respective electrode,
wherein
the memory stores software which, when executed by the processor, provides a wafer bow mapping based on the distance from each electrode to the opposing area of a wafer provided on the substrate holder, or
the memory stores software which, when executed by the processor, provides a 3D wafer bow mapping based on the distance from each electrode to the opposing area of a wafer provided on the substrate holder.

2. The apparatus of claim 1, wherein the air flow system includes a plurality of air inlets with each air inlet coupled to a respective plurality of the air outlets.

3. The apparatus of claim 1, wherein the air outlets are arranged on the support surface in a grid array pattern.

4. The apparatus of claim 1, wherein the plurality of electrodes are provided in a common plane such that the respective fixed distances of each electrode are equal.

5. The apparatus of claim 1, wherein the capacitor array unit comprises:
an insulating structure having a first surface facing the support surface and a second surface opposite to the first surface, the insulating structure supporting the plurality of electrodes; and
a plurality of signal lines supported by the insulating structure, each signal line being connected to a respective one of the plurality of electrodes.

6. The apparatus of claim 5, wherein each of the electrodes comprises a capacitor plate provided on the first surface of the insulating structure.

7. The apparatus of claim 5, wherein each of the electrodes comprises a capacitor plate which is at least partially embedded within the insulating structure.

8. The apparatus of claim 5, wherein each of the signal lines is at least partially embedded within the insulating structure.

9. The apparatus of claim 5, further comprising a cable coupled to the capacitor array unit and configured to bundle the plurality of signal lines as an input-output cable for the capacitor array unit.

10. The apparatus of claim 1, wherein the memory stores software which, when executed by the processor, controls air flow from the plurality of air outlets.

11. A method of measuring wafer bow comprising:

providing a plurality of electrodes each facing a respective area of a wafer provided on a support surface such that the electrode and respective area form a capacitor;

elevating the wafer by air flow from the support surface;

measuring a capacitance value at each electrode;

calculating a distance from each electrode to its respective area based on the measured capacitance at a respective electrode;

determining a bow of the wafer based on the calculated distances; and providing a 3D model of the wafer bow based on the calculated distances.

12. The method of claim 11, wherein the providing comprises providing multiple electrodes provided in a grid array.

13. The method of claim 11, further comprising controlling a process performed on the wafer based on the determined bow of the wafer.

14. The method of claim 11, further comprising performing a bow correction process on the wafer based on the determined bow of the wafer.

\* \* \* \* \*